(12) United States Patent
Matsumoto et al.

(10) Patent No.: US 11,146,750 B2
(45) Date of Patent: Oct. 12, 2021

(54) SOLID-STATE IMAGE SENSING DEVICE

(71) Applicant: SHARP KABUSHIKI KAISHA, Sakai (JP)

(72) Inventors: Yasuhiro Matsumoto, Sakai (JP); Yoshinao Morikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/927,562

(22) Filed: Jul. 13, 2020

(65) Prior Publication Data

US 2021/0037205 A1 Feb. 4, 2021

Related U.S. Application Data

(60) Provisional application No. 62/881,926, filed on Aug. 1, 2019.

(51) Int. Cl.
*H04N 5/3745* (2011.01)
*H01L 27/148* (2006.01)
*H04N 5/355* (2011.01)
*H04N 5/353* (2011.01)

(52) U.S. Cl.
CPC ... *H04N 5/37455* (2013.01); *H01L 27/14831* (2013.01); *H04N 5/3532* (2013.01); *H04N 5/3559* (2013.01)

(58) Field of Classification Search
CPC ............. H04N 5/37455; H04N 5/3532; H04N 5/3559; H01L 27/14831
See application file for complete search history.

(56) References Cited

U.S. PATENT DOCUMENTS

| 6,999,120 B1* | 2/2006 | Egawa | H04N 5/353 348/296 |
|---|---|---|---|
| 2008/0136950 A1 | 6/2008 | Nakajima | |
| 2011/0149135 A1 | 6/2011 | Yamanaka | |
| 2011/0242379 A1 | 10/2011 | Kato et al. | |
| 2013/0136234 A1* | 5/2013 | Noma | H04N 5/32 378/91 |
| 2014/0077058 A1 | 3/2014 | Sakano | |
| 2017/0195596 A1* | 7/2017 | Vogelsang | H04N 5/23232 |
| 2017/0289470 A1* | 10/2017 | Deng | H04N 5/3765 |
| 2018/0191982 A1* | 7/2018 | Berner | H04N 5/3745 |

FOREIGN PATENT DOCUMENTS

| JP | 2008-131127 A | 6/2008 |
|---|---|---|
| JP | 2011-216971 A | 10/2011 |
| JP | 2014-060519 A | 4/2014 |
| WO | 2010/023903 A1 | 3/2010 |

* cited by examiner

*Primary Examiner* — Jason A Flohre
(74) *Attorney, Agent, or Firm* — ScienBiziP, P.C.

(57) ABSTRACT

A solid-state image sensing device is of a global-shutter type and includes a vertical driving unit and an analog-to-digital (AD) converter. The vertical driving unit performs a shutter operation during a time period from when the AD converter starts an AD conversion to when the AD converter ends the AD conversion. The AD converter does not output a digital signal during a time period from when the vertical driving unit starts the shutter operation to when the vertical driving unit ends the shutter operation.

4 Claims, 5 Drawing Sheets

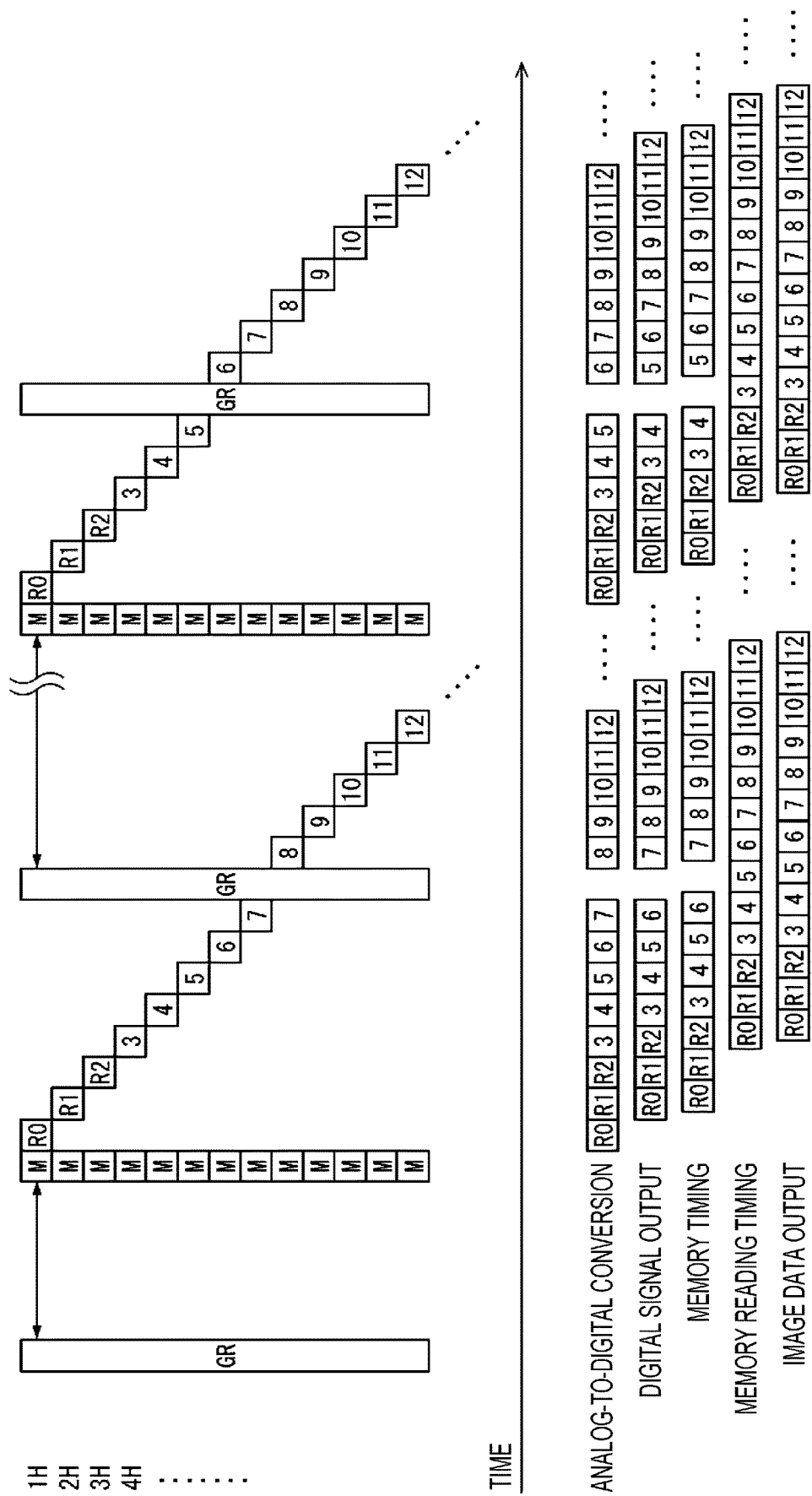

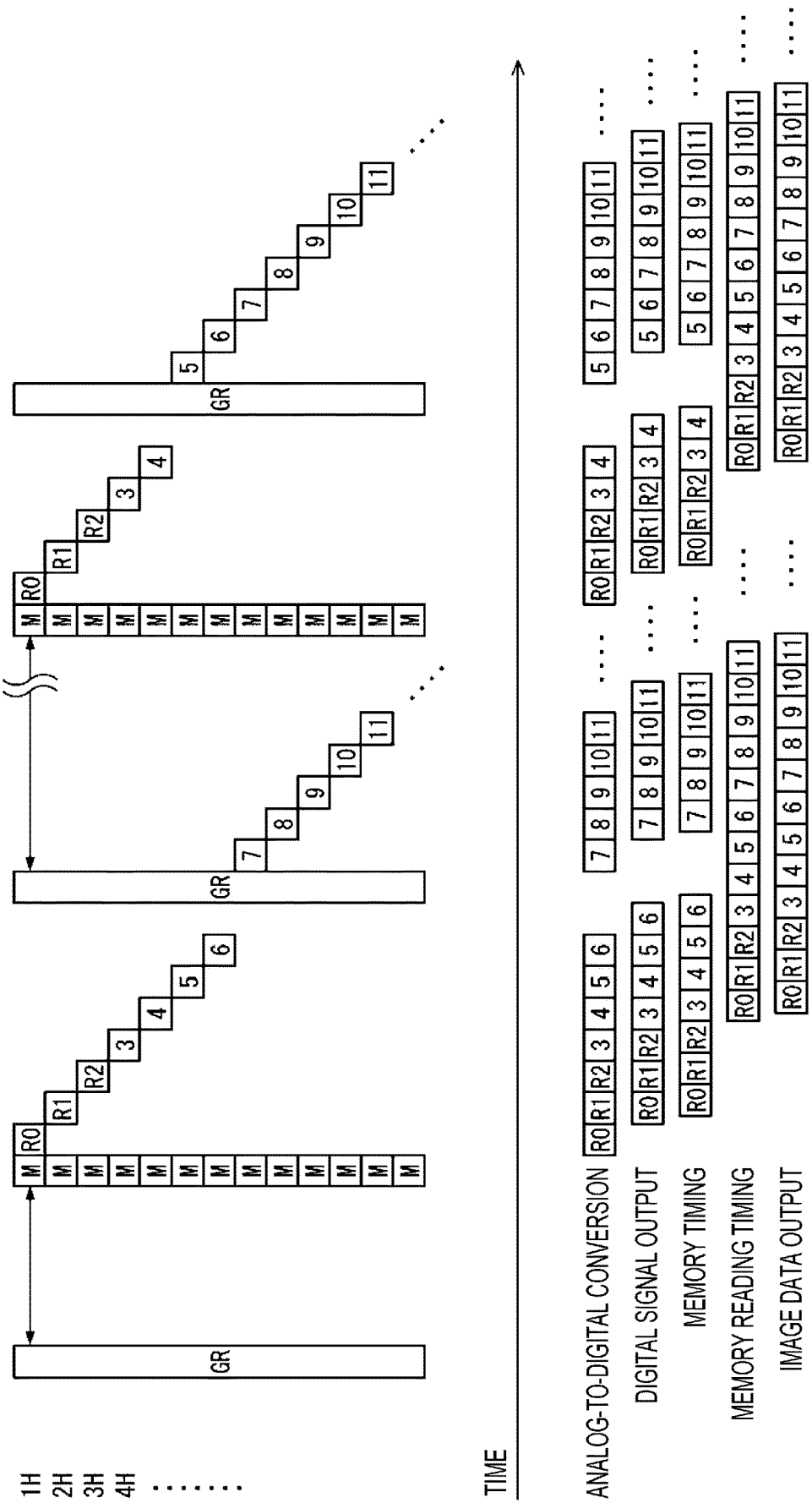

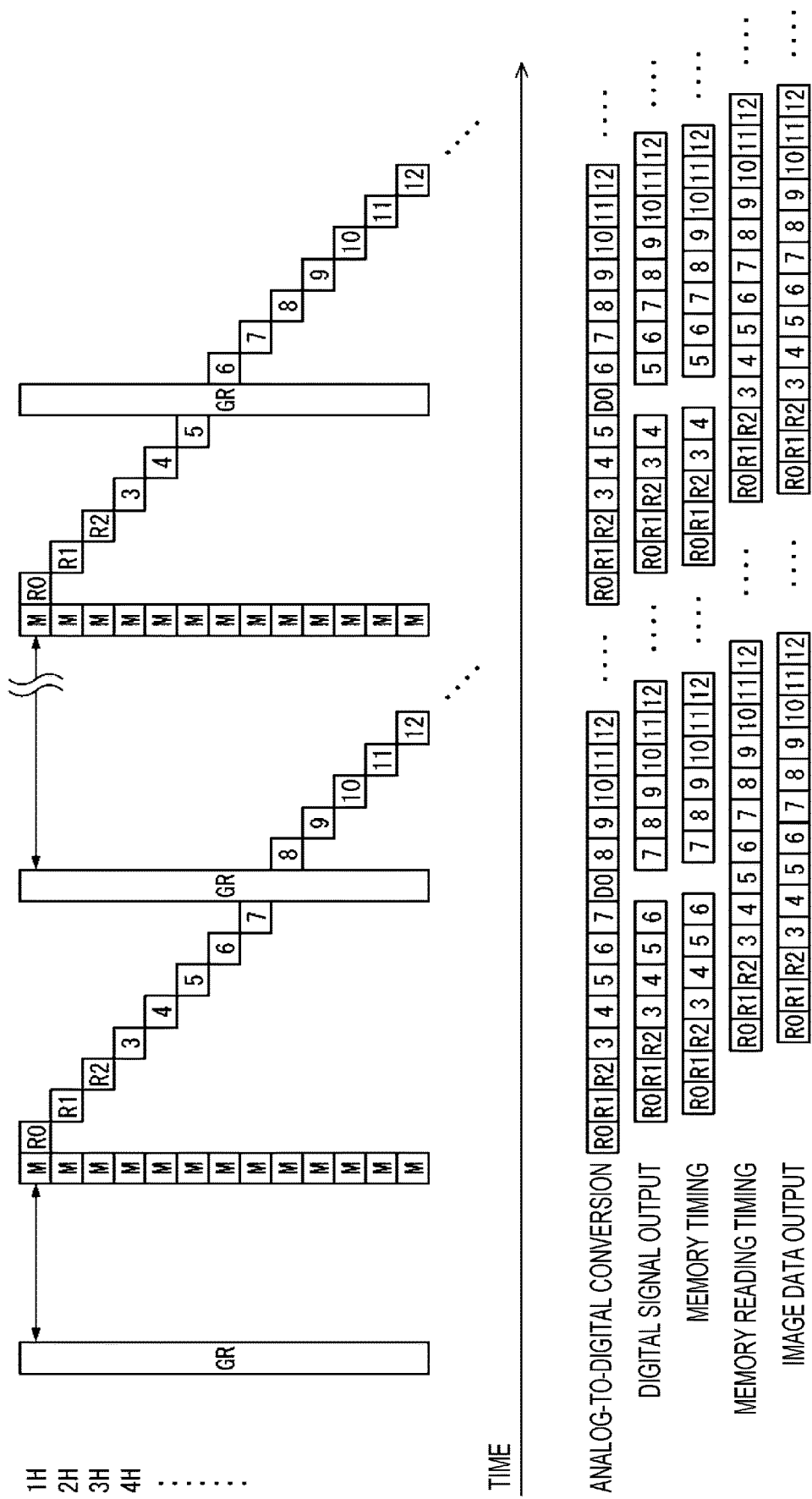

SOLID-STATE IMAGE SENSING DEVICE

BACKGROUND

1. Field

The present disclosure relates to a solid-state image sensing device.

2. Description of the Related Art

Active research and development efforts have been made for solid-state image sensing devices of a global-shutter type (hereinafter referred to as a "global shutter complementary metal-oxide semiconductor image sensor (CIS)") that outputs image data from all unit pixels at the same timing. The global shutter CIS of the related art suffers from large noise due to a fluctuation of power of a whole chip because all unit pixels are controlled to be active during a shutter operation. The global shutter CIS is thus unable to perform other operations including an analog-to-digital (AD) conversion during the shutter operation and thus operates sequentially, for example, by starting the AD conversion after the end of exposure time. An image sensing device disclosed in International Publication No. 2010/023903 is of the global-shutter type and thus operates sequentially.

Global shutter CISs that perform the AD conversion during the exposure time have been developed. For example, Japanese Unexamined Patent Application Publication No. 2014-60519 discloses a solid-state image sensing device that performs an AD conversion on signals during the exposure time by performing pixel charge accumulation using only photodiodes during the exposure time.

The shutter types of solid-state image sensing devices of the related art include the global-shutter type described above and rolling-shutter type that outputs image data at timings different from row to row of unit pixels. The rolling-shutter type solid-state image sensing device (hereinafter referred to as a "rolling shutter CIS") performs the shutter operation during the AD conversion of signals. The image sensing device disclosed in International Publication No. 2010/023903 starts the AD conversion subsequent to the end of exposure time and does not perform the shutter operation during the AD conversion. In view of the rolling shutter CIS, the image sensing device has a problem of a reduced frame rate.

The solid-state image sensing device disclosed in Japanese Unexamined Patent Application Publication No. 2014-60519 has a frame rate higher than the frame rate of the global shutter CIS that starts the AD conversion on signals subsequent to the exposure time. However, the solid-state image sensing device does not transfer charge accumulated at the photodiode to an analog memory of a unit pixel and does not perform charge accumulation at the analog memory. For this reason, the solid-state image sensing device has a problem of a reduction in the dynamic range of saturated charge amount.

It is desirable to provide a global shutter CIS that controls or mitigates a reduction in a dynamic range of a saturated charge amount and has almost the same level of a frame rate as a rolling shutter CIS.

SUMMARY

According to an aspect of the disclosure, there is provided a solid-state image sensing device circuit. The solid-state image sensing device includes multiple unit pixels arranged in a matrix, each unit pixel including a photoelectric conversion element that generates and accumulates charge in a charge amount responsive to an incident light quantity and a memory that accumulates the charge transferred from the photoelectric conversion element, a vertical driving unit that performs a shutter operation and reads from the unit pixels an analog signal related to the charge amount of the charge accumulated on the memories, and an analog-to-digital (AD) converter that performs an analog-to-digital (AD) conversion on the analog signal read by the vertical driving unit. The vertical driving unit performs the shutter operation during a time period from when the AD converter starts the AD conversion to when the AD converter ends the AD conversion. The AD converter does not output a digital signal during a time period from when the vertical driving unit starts the shutter operation to when the vertical driving unit ends the shutter operation.

According to an aspect of the disclosure, there is provided a solid-state image sensing device circuit. The solid-state image sensing device of a global-shutter type includes multiple unit pixels arranged in a matrix, each unit pixel including a photoelectric conversion element that generates and accumulates charge in a charge amount responsive to an incident light quantity and a memory that accumulates the charge transferred from the photoelectric conversion element, a vertical driving unit that performs a shutter operation and reads from the unit pixels an analog signal related to the charge amount of the charge accumulated on the memories, and an AD converter that performs an AD conversion on the analog signal read by the vertical driving unit. The vertical driving unit performs the shutter operation during a time period from when the AD converter starts the AD conversion to when the AD converter ends the AD conversion. The AD converter performs the AD conversion even during a time period from when the vertical driving unit starts the shutter operation to when the vertical driving unit ends the shutter operation and invalidates a digital signal generated in the AD conversion.

BRIEF DESCRIPTION OF THE DRAWINGS

FIG. 3 is a timing diagram illustrating an example of an output principle of image data on the solid-state image sensing device;

FIG. 4 is a timing diagram illustrating an example of the output principle of the image data on the solid-state image sensing device according to a first modification of the embodiment of the present disclosure; and FIG. 5 is a timing diagram illustrating an example of the output principle of the image data on the solid-state image sensing device according to a second modification of the embodiment of the present disclosure.

DESCRIPTION OF THE EMBODIMENTS

Circuit Configuration of Solid-State Image Sensing Device

A circuit configuration of a solid-state image sensing device 1 of an embodiment of the present disclosure is described with reference to FIG. 1. The solid-state image sensing device 1 is a global-shutter type complementary metal oxide semiconductor (CMOS) image sensor.

Figure 1:
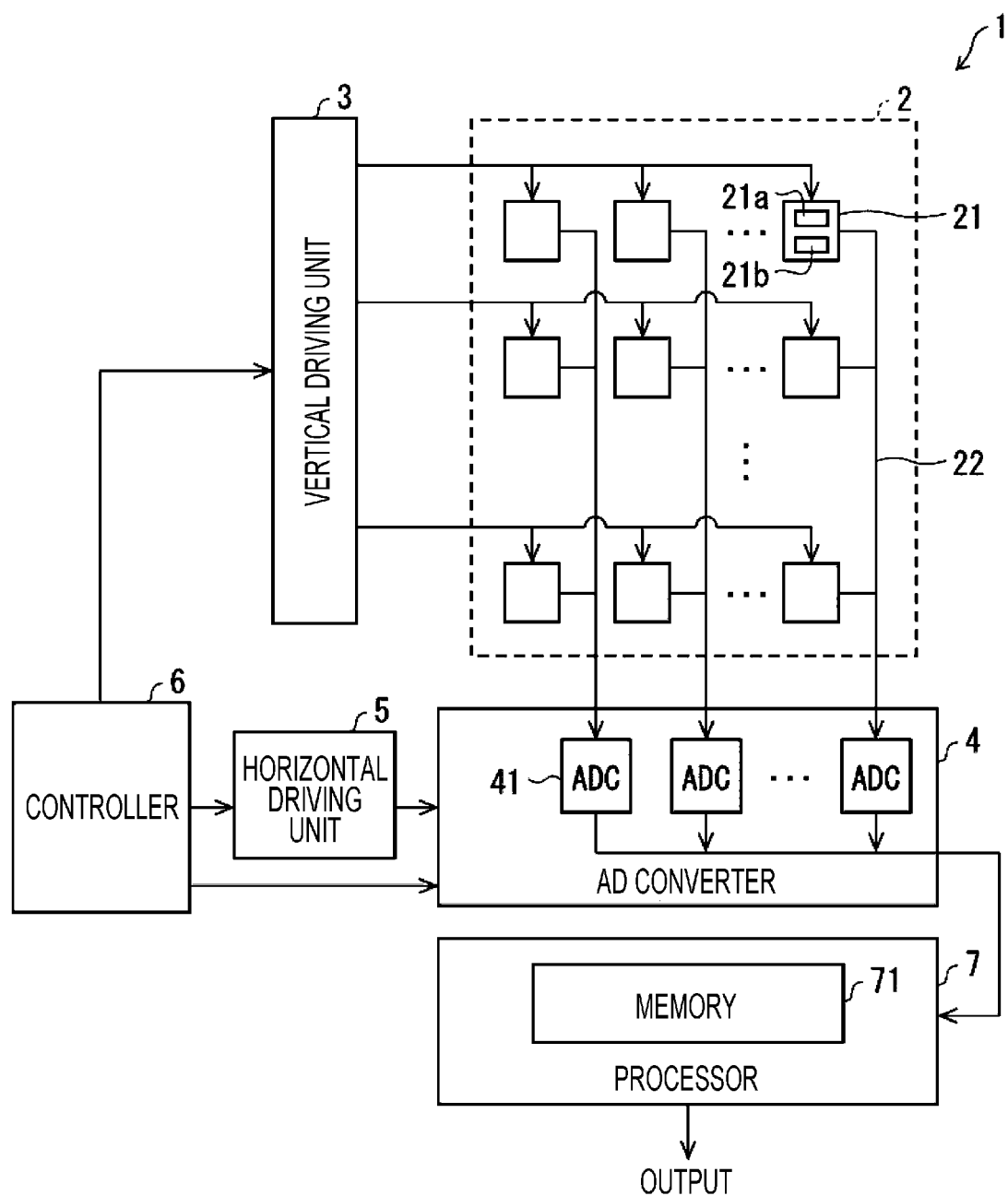
FIG. 1 is a circuit diagram illustrating a general configuration of a solid-state image sensing device of an embodiment of the present disclosure.

Referring to FIG. 1, the solid-state image sensing device 1 includes a pixel array unit 2, vertical driving unit 3, analog-to-digital converter (ADC) unit 4, horizontal driving unit 5, controller 6, and processor 7. The pixel array unit 2 includes unit pixels 21 arranged in a matrix of m rows and n columns (each of n and m is an integer of 2 or more). The "row" represents a line of unit pixels 21 extending in the lateral direction of the page of FIG. 1 and the "column" represents a line of unit pixels 21 extending in the vertical direction of the page of FIG. 1.

The unit pixel 21 includes a photodiode 21a that generates and accumulates charge in a charge amount responsive to an incident light quantity. The unit pixel 21 is an example of a photoelectric conversion element of the present disclosure. The unit pixel 21 further includes an analog memory 21b to which the charge accumulated on the photodiode 21a is transferred. The analog memory 21b is an example of a memory in the present disclosure and accumulates and thus temporarily stores the charge transferred from the photodiode 21a until the start of the read operation of the vertical driving unit 3.

The vertical driving unit 3 includes a shift register or an address recorder and concurrently drives all the unit pixels 21 in the pixel array unit 2 or drives the unit pixel 21 on a row by row basis. Specifically, the vertical driving unit 3 performs a shutter operation and read operation. The shutter operation and read operation are described in detail below.

The AD converter 4 includes n ADCs 41. Specifically, each column of the unit pixels 21 is connected to one ADC 41 via a vertical signal line 22. The vertical signal line 22 is formed for and along each column of the unit pixels 21. The ADC 41 is an analog-to-digital (AD) converter and AD converts an analog signal output from multiple unit pixels 21 via the read operation of the vertical driving unit 3 to generate a digital signal. The generated digital signal is output to the processor 7 from each ADC 41.

The horizontal driving unit 5 includes a shift register or timing generator and sequentially selects the n ADCs 41 in order in the AD converter 4. Via this selective scanning, the digital signals generated in the AD converter 4 are sequentially output to the processor 7.

The controller 6 includes a timing generator that outputs a variety of timing signals. The controller 6 thus performs drive control on the vertical driving unit 3 and horizontal driving unit 5 by outputting the generated timing signals.

The controller 6 controls the shutter operation of the vertical driving unit 3 and the AD conversion of the AD converter 4 such that multiple shutter operations of the vertical driving unit 3 and multiple AD conversions of the AD converter 4 are pipeline-processed. Via this control, the frame rate of the solid-state image sensing device 1 is even more increased. The control process of the controller 6 to control the vertical driving unit 3 and AD converter 4 to implement the pipeline process is not necessarily performed.

The processor 7 includes at least an addition function. The processor 7 performs signal processing on the digital data output from the AD converter 4 to generate and output image data. The signal processing is performed in concert with each AD conversion performed by the AD converter 4.

The processor 7 includes a storage unit 71 that stores multiple digital signals output by the AD converter 4 each time the AD conversion is performed. The storage unit 71 includes SRAM (Static Random-Access Memory). The storage unit 71 stores a variety of data used in the signal processing of the processor 7 and image data generated in the signal processing of the processor 7. The storage unit 71 may not necessarily be included in the processor 7. For example, the storage unit 71 may be included in the solid-state image sensing device 1 and may be external to the processor 7.

Operation of the Solid-State Image Sensing Device

Figure 2:
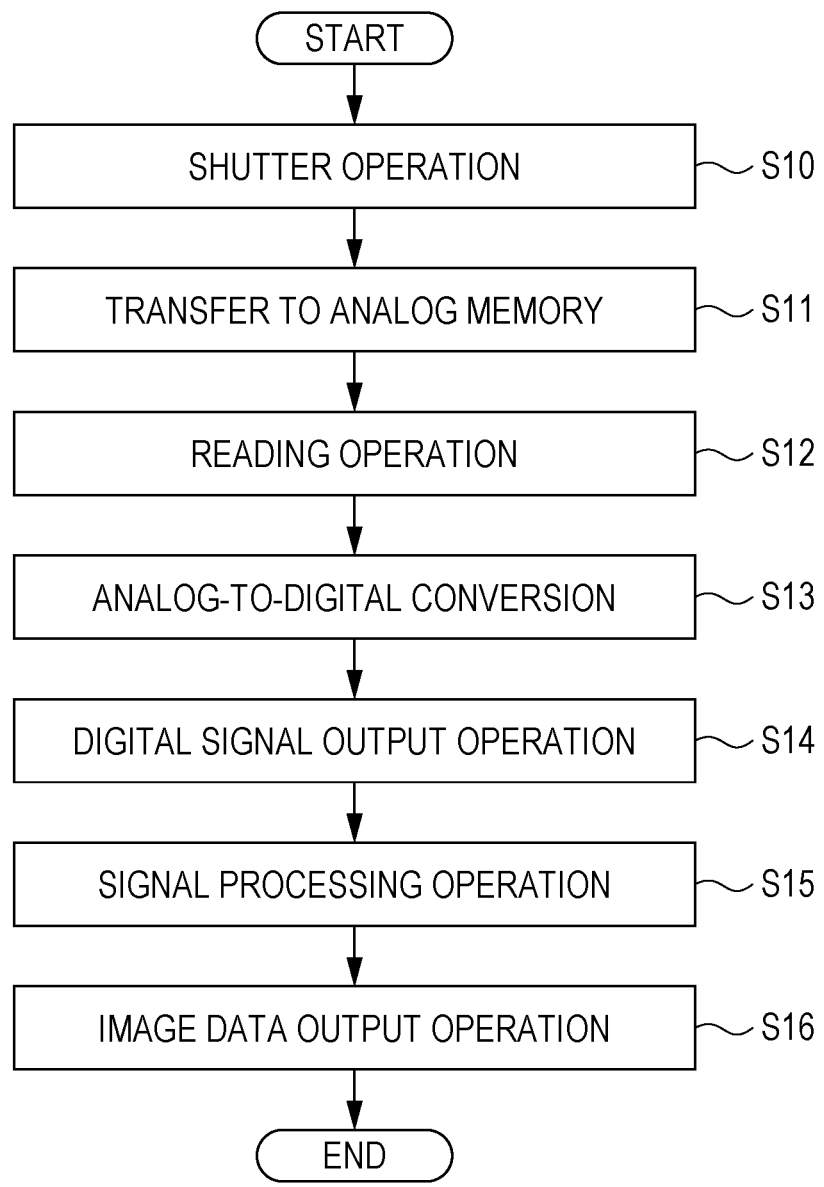
FIG. 2 is a flowchart illustrating a general process of the solid-state image sensing device.

Referring to FIG. 2, the general process of the solid-state image sensing device 1 is described. The vertical driving unit 3 performs the shutter operation (S10). In the shutter operation, the vertical driving unit 3 drains unwanted charge accumulated on the photodiodes 21a of all the unit pixels 21 first and then causes all the photodiodes 21a to accumulate new charges. In other words, in the shutter operation, the vertical driving unit 3 resets the photodiodes 21a of multiple unit pixels 21 and causes the photodiode 21a to perform exposure subsequent to the resetting.

Subsequent to S10, all the photodiodes 21a having started to accumulate new charges transfer the charges to the analog memories 21b (S11). The analog memory 21b temporarily accumulates the transferred charge. Subsequent to S11, the vertical driving unit 3 performs a read operation (S12).

In the read operation, analog signals related to amounts of charges accumulated on the analog memories 21b are read from all the unit pixels 21 after the shutter operation. Specifically, the vertical driving unit 3 outputs to the pixel array unit 2 selection signals to select all the unit pixels 21. Each unit pixel 21 having received the selection signal converts, into an analog signal, information related to an amount of charge accumulated in the analog memory 21b. The vertical driving unit 3 then causes each unit pixel 21 to output the analog signal as a result of the conversion. This series of steps is the read operation. The analog signals output from all the unit pixels 21 are input to the AD converter 4 via the corresponding vertical signal line 22.

The period consumed to perform S10 through S12, namely, the period from the timing of draining the unwanted charge in the shutter operation to the timing of reading the analog signal in the read operation is accumulation time of charge in each of the unit pixels 21, in other words, exposure time.

Subsequent to S12, the AD converter 4 generates a digital signal by analog-to-signal converting the input analog signal (S13). During the period from when the AD converter 4 starts the AD conversion to when the AD converter 4 ends the AD conversion, the vertical driving unit 3 performs a next shutter operation at any timing subsequent to the shutter operation in S10. In the following discussion, the next shutter operation subsequent to the shutter operation in S10 is referred to as a "next-time shutter operation".

The AD converter 4 temporarily suspends the AD conversion during the period from when the vertical driving unit 3 starts the next-time shutter operation to when the vertical driving unit 3 ends the next-time shutter operation. The AD converter 4 does not generate the digital signals for a column of the unit pixels 21 that are originally scheduled to be generated during the period from when the vertical driving unit 3 starts the next-time shutter operation to when the vertical driving unit 3 ends the next-time shutter operation.

Subsequent to S13, the AD converter 4 successively outputs the digital signals generated by the ADCs 41 via selective scanning of the horizontal driving unit 5 (S14). Note that the AD converter 4 temporarily suspends the output operation of the digital signals during the period from when the vertical driving unit 3 starts the next-time shutter operation to when the vertical driving unit 3 ends the next-time shutter operation. The digital signal output from the AD converter 4 is stored on the storage unit 71 in the processor 7.

Subsequent to S14, the processor 7 generates image data by performing signal processing on the digital signals stored on the storage unit 71 (S15). The signal processing uses as buffer data the digital signals that correspond to two or more rows of the unit pixels 21 and are scheduled to be generated during the period in the AD converter 4 suspends the AD conversion, from among the digital signals stored on the storage unit 71. According to the embodiment, the processor 7 uses the buffer data corresponding to the two rows of the unit pixels 21.

The processor 7 generates the image data via the signal processing by reading basic image data from the storage unit 71 and by performing a variety of image processing tasks on the basic image data. The basic image data includes the digital signal and buffer data stored on the storage unit 71. The processor 7 performs, on the basic image data, level corrections, such as digital gain correction and black level adjustment, and arithmetic mean operation. Subsequent to generating the image data, the processor 7 temporarily stores the image data on the storage unit 71. Note that the processor 7 may immediately output the generated image data without storing the image data on the storage unit 71.

The variety of image processing tasks by the processor 7 may not necessarily be performed on the basic image data read from the storage unit 71. For example, the processor 7 may perform the variety of image processing tasks on the digital signal output from the AD converter 4 before being stored on the storage unit 71. In this case, the digital signal having undergone the variety of image processing tasks are stored on the storage unit 71.

Subsequent to S16, the processor 7 reads the generated image data from the storage unit 71 and then outputs the read image data (S16). By using the buffer data, the processor 7 outputs the image data in a seamless fashion.

The solid-state image sensing device 1 performs the operations in S10 through S16 each time the shutter operation is repeated. The operations in S10 through S16 are pipeline-processed via the control process of the controller 6 that controls the shutter operation of the vertical driving unit 3 and the AD conversion of the AD converter 4.

While the solid-state image sensing device 1 performs the operations in S10 through S16, the AD converter 4 may perform the AD conversion during the time period from when the vertical driving unit 3 starts the next-time shutter operation to when the vertical driving unit 3 ends the next-time shutter operation. In this case, the AD converter 4 is to temporarily suspend an output operation to output the digital signal during the time period from when the vertical driving unit 3 starts the next-time shutter operation to when the vertical driving unit 3 ends the next-time shutter operation.

Alternatively, the AD converter 4 may perform the output operation to output the digital signal during even the time period from when the vertical driving unit 3 starts the next-time shutter operation to when the vertical driving unit 3 ends the next-time shutter operation. In this case, however, the AD converter 4 is to temporarily suspend the AD conversion during the period from when the vertical driving unit 3 starts the next-time shutter operation to when the vertical driving unit 3 ends the next-time shutter operation.

Specifically, the solid-state image sensing device 1 may be configured such that the AD converter 4 does not output the digital signal during the time period from when the vertical driving unit 3 starts the shutter operation to when the vertical driving unit 3 ends the shutter operation. Output principle of image data Referring to FIG. 3, the output principle of the image data of the solid-state image sensing device 1 is described below. In FIG. 3, "H" denotes a row of unit pixels 21. For example, "1H through 4H" denote the unit pixels 21 at the first row through the unit pixels 21 at the fourth row. In FIG. 3, "GR" denotes the shutter operation, "M" denotes a transfer of charge to the analog memory 21b, and "R" denotes digital signals of a column of unit pixels 21 generated via the AD conversion.

"Memory timing" in FIG. 3 represents a timing when the storage unit 71 stores the digital signal output from the AD converter 4. "Reading memory timing" represents a timing when the processor 7 reads the digital signal from the storage unit 71 for the signal processing. The same is true of FIGS. 4 and 5.

The vertical driving unit 3 performs a first-time GR at all the unit pixels 21 from 1H to mH as illustrated in the upper portion above a time axis on the page of FIG. 3 (an arrow-headed line extended from left to right on the page of FIG. 3). Once the first-time GR is performed, the photodiodes 21a in all the unit pixels 21 concurrently perform M.

In the read operation, the vertical driving unit 3 successively outputs analog signals, starting with 1H, to the AD converter 4. The AD converter 4 having received the analog signals successively performs the AD conversion on the analog signals, starting with the 1H analog signal. Referring to FIG. 3, "R0" denotes a 1H digital signal, "R1" denotes a 2H digital signal, "3" denotes a 4H digital signal, and so on.

Referring to FIG. 3, the vertical driving unit 3 performs a second-time GR at the timing when a 9H analog signal is originally scheduled to be AD converted. The AD converter 4 temporarily suspends the AD conversion during the second-time GR. After the completion of the second-time GR, the AD converter 4 resumes the AD conversion. A 9H digital signal "8" and subsequent digital signals are generated at a timing that is shifted by a time duration equal to the second-time GR.

The suspension of the AD conversion creates a blank period where no digital signal is present, as illustrated in the lower portion below the time axis on the page of FIG. 3. The blank period is a time band at the timing when the 9H digital signal 8 is originally scheduled to be generated.

The horizontal driving unit 5 successively outputs the generated digital signals 1H through mH from the AD converter 4. Since the time band at the timing when the 9H digital signal 8 is originally scheduled to be generated corresponds to the second-time GR, the AD converter 4 temporarily suspends the output operation of the digital signal during the time band. The time band at the timing when the 8H digital signal "7" is originally scheduled to be output becomes the blank period where the digital signal to be transferred is not present.

After the completion of the second-time GR, the horizontal driving unit 5 causes the AD converter 4 to resume the output operation to output the digital signal. The 8H digital signal 7 and subsequent digital signals are shifted in output timing by a time duration of the second-time GR.

Since the digital signal 7 and subsequent digital signals output by the AD converter 4 are shifted in output timing by the time duration of the second-time GR, memory timing is also shifted by a time duration of the second-time GR as illustrated in the lower portion below the time axis on the page of FIG. 3. The time band at the timing when the 8H digital signal 7 is originally scheduled to be stored on the storage unit 71 is a blank period where any digital signal to be stored is not present.

"Memory reading timing" is set such that the processor 7 reads in the signal processing each digital signal from the storage unit 71 with time shifted by a time duration to read a 1H digital signal. In the signal processing, the processor 7 reads from the storage unit 71 the buffer data corresponding to two rows of the unit pixels 21. Referring to FIG. 3, the processor 7 reads from the storage unit 71 the digital signals 7 and 8, as the buffer data, generated and output in the past by the AD converter 4. In the next signal processing, the processor 7 reads from the storage unit 71 the digital signals 5 and 6, as the buffer data, generated and output in the past by the AD converter 4.

For this reason, any blank period having no digital signal does not occur at the memory reading timing. The processor 7 may thus perform signal processing on the digital signals in the same seamless fashion as in the global shutter CIS of the related art.

Since the signal processing is performed at the timing described above, the processor 7 may output the image data as illustrated in the lower portion below the time axis on the page of FIG. 3 in the same seamless fashion as in the global shutter CIS of the related art.

The processor 7 may not necessarily use in the signal processing the buffer data corresponding to two or more rows of the unit pixels 21. In such a case, although a blank period having no image data occurs at the output of the image data, a reduction in the dynamic range of saturated charge amount is controlled or mitigated while a frame rate almost as high as that performed in the rolling shutter CIS may be achieved.

Modifications

A modification of the solid-state image sensing device 1 of the embodiment of the present disclosure is described referring to FIGS. 4 and 5. For convenience of explanation, elements having the same functions as those described with reference to the embodiment are designated with the same reference numerals and the discussion thereof is not repeated.

First Modification

The processor 7 in the solid-state image sensing device 1 may use in the signal processing the buffer data corresponding to three rows of the unit pixels 21 as illustrated in FIG. 4. As illustrated in the lower portion below the time axis on the page of FIG. 4, the vertical driving unit 3 performs the second-time GR at the timing when the 9H analog signal is originally scheduled to be AD converted. The AD converter 4 temporarily suspends the AD conversion during the time period from the start to the end of the second-time GR (hereinafter referred to as a "period of the second-time GR") and during the time period while the 8H analog signal is originally scheduled to be AD converted. Specifically, the AD converter 4 temporarily suspends the AD conversion not only during the period of the second-time GR but also during the AD conversion that is performed at the timing immediately prior to the timing of the second-time GR.

After the completion of the second-time GR, the AD converter 4 resumes the AD conversion. For this reason, the 8H digital signal 7 and subsequent digital signals are shifted in generation timing by the time period corresponding to the second-time GR and the time period while the 8H analog signal is AD converted.

Because of the suspension of the AD conversion, the time band at the timing when the 8H and 9H digital signals 7 and 8 are originally scheduled to be generated becomes a blank period having no digital signal as illustrated in the lower portion below the time axis on the page of FIG. 4.

The horizontal driving unit 5 causes the AD converter 4 to successively output the generated digital signals 1H through mH. The time band at the timing when the 8H and 9H digital signals 7 and 8 are originally scheduled to be output becomes a blank period having no digital signal to be transferred.

After the completion of the second-time GR, the horizontal driving unit 5 causes the AD converter 4 to resume the output operation to output the digital signal. The 8H digital signal 7 and subsequent digital signals are shifted in output timing by a time duration corresponding to the second-time GR and the time period used to AD convert the 8H analog signal.

The digital signal 7 and subsequent digital signals output from the AD converter 4 are shifted in output timing by the time duration and time period, the memory timing is also shifted by the time duration and time period as illustrated in the lower portion below the time axis on the page of FIG. 4. The time band at the timing when the 8H and 9H digital signals as the digital signals 7 and 8 are originally scheduled to be stored on the storage unit 71 becomes a blank period having no digital signal to be stored.

In the signal processing of the processor 7, however, the memory reading timing is set such that the processor 7 reads in the signal processing thereof each digital signal from the storage unit 71 in reading timing shifted by a time used to read digital signals for 2 "Hs". The processor 7 reads in the signal processing thereof the buffer data corresponding to three rows of the unit pixels 21. For this reason, the blank period having no digital signal is not present at the memory reading timing. The processor 7 may thus perform signal processing on the digital signals in the same seamless fashion as in the global shutter CIS of the related art.

Since the signal processing is performed at the timings described above, the processor 7 may output the image data in the same seamless fashion as in the global shutter CIS of the related art as illustrated in the lower portion below the time axis on the page of FIG. 4.

In the modification in FIG. 4, the period throughout which the AD conversion is temporarily suspended, excluding the second-time GR, may be a period while the AD conversion is performed at a timing that comes after the timing of the second-time GR.

Second Modification

Referring to FIG. 5, the solid-state image sensing device 1 may perform the AD conversion during a time period from when the vertical driving unit 3 starts the second-time GR to when the vertical driving unit 3 ends the second-time GR. In such a case, the AD converter 4 invalidates the digital signal generated via the AD conversion.

Referring to FIG. 5, the vertical driving unit 3 performs the second-time GR at the timing when the 9H analog signal is AD converted as illustrated in the upper portion above the time axis on the page of FIG. 5. However, since the AD converter 4 still performs the AD conversion during the second-time GR, the 9H analog signal is AD converted.

The AD converter 4 does not set the 9H digital signal generated during the second-time GR to a digital signal 8 serving as a target of the signal processing because the 9H digital signal is affected by noise. Specifically, as illustrated in the lower portion below the time axis on the page of FIG. 5, the AD converter 4 sets the 9H digital signal generated during the second-time GR to a dummy signal D0 that does not undergo the signal processing. The AD converter 4 then invalidates the thus generated dummy signal D0. For example, the "invalidation of the dummy signal D0" may include a process that stores and keeps the dummy signal D0 on an unillustrated memory in the AD converter 4 or a process that deletes the dummy signal D0.

The operation of each element of the solid-state image sensing device 1 after the invalidation of the dummy signal D0, the output timing of the digital signal, and the memory timing and the manner of using the buffer data remain identical to those of in FIG. 3. If the method of invalidating the digital signal affected by noise is employed in this way, the image data may be output in the same seamless fashion as in the global shutter CIS of the related art.

According to a first aspect of the present disclosure, there is provided solid-state image sensing device 1 of a global-shutter type. The global-shutter type solid-state image sensing device 1 includes multiple unit pixels 21 arranged in a matrix, each unit pixel including a photoelectric conversion element (photodiode 21*a*) that generates and accumulates charge in a charge amount responsive to an incident light quantity and a memory (analog memory 21*b*) that accumulates the charge transferred from the photoelectric conversion element, a vertical driving unit 3 that performs a shutter operation and reads from the unit pixels an analog signal related to the charge amount of the charge accumulated on the memories, and an AD converter 4 that performs an AD conversion on the analog signal read by the vertical driving unit. The vertical driving unit performs the shutter operation during a time period from when the AD converter starts the AD conversion to when the AD converter ends the AD conversion. The AD converter does not output a digital signal during a time period from when the vertical driving unit starts the shutter operation to when the vertical driving unit ends the shutter operation.

In the configuration described above, the vertical driving unit performs the shutter operation during the time period from when the AD converter starts the AD conversion to when the AD converter ends the AD conversion. During the time period from when the vertical driving unit starts the shutter operation to when the vertical driving unit ends the shutter operation, the AD converter does not output the digital signal affected by noise. For this reason, the AD converter may output the digital signal that is free from the effect of noise attributed to the execution of the shutter operation during the AD conversion. The solid-state image sensing device of the global-shutter type (hereinafter referred to as a "global shutter CIS") may achieve almost the same level of a frame rate as that performed by a solid-state image sensing device of a rolling-shutter type (hereinafter referred to as a "rolling shutter CIS").

Further in the configuration, the memory of each of the unit pixels accumulates charge transferred from the photoelectric conversion element. In other words, the memory is used to accumulate the charge generated in the photoelectric conversion element. The global shutter CIS having almost the same level of a frame rate as that performed by the rolling shutter CIS may control or mitigate a reduction in the dynamic range of the saturated charge amount.

The solid-state image sensing device in a second aspect of the present disclosure in view of the first aspect may further include a controller that controls the shutter operation performed by the vertical driving unit and the AD conversion performed by the AD converter such that multiple shutter operations performed by the vertical driving unit and multiple AD conversions performed by the AD converter are pipeline-processed.

In the configuration described above, the controller pipeline-processes the shutter operations and the AD conversions. The global shutter CIS may have an increased frame rate.

In the global-shutter type solid-state image sensing device in a third aspect of the present disclosure in view of one of the first and second aspects, the AD converter may suspend an output operation to output the digital signal during the time period from when the vertical driving unit starts the shutter operation to when the vertical driving unit ends the shutter operation.

In the configuration described above, the operation performed by the AD converter to output the digital signal is free from the effect of noise attributed to the temporary suspension of the AD conversion during the time period from when the vertical driving unit starts the shutter operation to when the vertical driving unit ends the shutter operation. For this reason, when the AD conversion is resumed, the AD converter may stably perform the operation to output the digital signal.

The global-shutter type solid-state image sensing device in a fourth aspect of the present disclosure in view of the third aspect may further include a storage unit 71 that stores multiple the digital signals that are output by the AD converter each time when the AD converter performs the AD conversion, and a processor 7 that performs signal processing on the digital signals that are output by the AD converter each time when the AD converter performs the AD conversion. The AD converter suspends the AD conversion during the time period from when the vertical driving unit starts the shutter operation to when the vertical driving unit ends the shutter operation. The processor uses in the signal processing the digital signals serving as buffer data from among the digital signals stored on the storage unit. The digital signals serving as the buffer data correspond to two rows or more of the unit pixels and are scheduled to be generated during the time period while the AD converter suspends the AD conversion.

In the configuration described above, even if the vertical driving unit suspends the output operation to output the digital signal during the time period from the start of the shutter operation to the end of the shutter operation, the processor may use the buffer data corresponding to two rows or more of the unit pixels in the signal processing. Even if the vertical driving unit suspends the output operation to output the digital signal and the AD converter suspends the AD conversion, the image data may be output in the seamless fashion via the signal processing.

According to a fifth aspect of the present disclosure, there is provided a solid-state image sensing device 1 of a global-shutter type. The solid-state image sensing device 1 includes multiple unit pixels 21 arranged in a matrix, each unit pixel including a photoelectric conversion element (photodiode 21*a*) that generates and accumulates charge in a charge amount responsive to an incident light quantity and a memory (analog memory 21*b*) that accumulates the charge transferred from the photoelectric conversion element, a vertical driving unit 2 that performs a shutter operation and reads from the unit pixels an analog signal related to the charge amount of the charge accumulated on the memories, and an AD converter 4 that performs an AD conversion on the analog signal read by the vertical driving unit. The vertical driving unit performs the shutter operation during a time period from when the AD converter starts the AD conversion to when the AD converter ends the AD conversion. The AD converter performs the AD conversion even during a time period from when the vertical driving unit starts the shutter operation to when the vertical driving unit ends the shutter operation and invalidates a digital signal generated in the AD conversion.

In the configuration described above, the AD converter performs the AD conversion while outputting the digital signal free from the effect of noise attributed to the execution of the shutter operation during the AD conversion. For this reason, the noise generated during a series of operations of the AD converter is thus reduced while the AD conversion is performed in the same manner as in a standard AD converter. Since the AD converter may employ the control and circuit configuration substantially identical that of the standard AD converter, the global shutter CIS providing stable performance is thus implemented.

The present disclosure is not limited to the embodiment and modifications described above. A variety of modifications are possible within the scope described in the claims. An embodiment resulting from combining technical means respectively disclosed in the embodiment and different modifications may fall within the technical scope of the present disclosure. A new technical feature may result by combining technical means respectively disclosed in the embodiment and modifications.

The present disclosure contains subject matter related to that disclosed in US Provisional Patent Application JP 62/881926 filed in the US Patent Office on Aug. 1, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image sensing device of a global-shutter type comprising:
    a plurality of unit pixels arranged in a matrix, each unit pixel including a photoelectric conversion element that generates and accumulates charge in a charge amount responsive to an incident light quantity and a memory that accumulates the charge transferred from the photoelectric conversion element, a vertical driving unit that performs a shutter operation and reads from the unit pixels an analog signal related to the charge amount of the charge accumulated on the memories, and
    an analog-to-digital (AD) converter that performs an analog-to-digital (AD) conversion on the analog signal read by the vertical driving unit, wherein the vertical driving unit performs the shutter operation during a time period from when the AD converter starts the AD conversion to when the AD converter ends the AD conversion, and
    wherein the AD converter does not output a digital signal during a time period from when the vertical driving unit starts the shutter operation to when the vertical driving unit ends the shutter operation,
    a storage unit that stores a plurality of the digital signals that are output by the AD converter each time when the AD converter performs the AD conversion, and
    a processor that performs signal processing on the digital signals that are output by the AD converter each time when the AD converter performs the AD conversion, wherein the AD converter suspends the AD conversion during the time period from when the vertical driving unit starts the shutter operation to when the vertical driving unit ends the shutter operation, and
    wherein the processor uses in the signal processing the digital signals serving as buffer data from among the digital signals stored on the storage unit, the digital signals serving as the buffer data corresponding to two rows or more of the unit pixels and scheduled to be generated during the time period while the AD converter suspends the AD conversion.

2. The solid-state image sensing device according to claim 1, further comprising a controller that controls the shutter operation performed by the vertical driving unit and the AD conversion performed by the AD converter such that multiple shutter operations performed by the vertical driving unit and multiple AD conversions performed by the AD converter are pipeline-processed.

3. The solid-state image sensing device according to claim 1, wherein the AD converter suspends an output operation to output the digital signal during the time period from when the vertical driving unit starts the shutter operation to when the vertical driving unit ends the shutter operation.

4. A solid-state image sensing device of a global-shutter type comprising:
    a plurality of unit pixels arranged in a matrix, each unit pixel including a photoelectric conversion element that generates and accumulates charge in a charge amount responsive to an incident light quantity and a memory that accumulates the charge transferred from the photoelectric conversion element,
    a vertical driving unit that performs a shutter operation and reads from the unit pixels an analog signal related to the charge amount of the charge accumulated on the memories, and
    an analog-to-digital (AD) converter that performs an analog-to-digital (AD) conversion on the analog signal read by the vertical driving unit,
    wherein the vertical driving unit performs the shutter operation during a time period from when the AD converter starts the AD conversion to when the AD converter ends the AD conversion, and
    wherein the AD converter performs the AD conversion even during a time period from when the vertical driving unit starts the shutter operation to when the vertical driving unit ends the shutter operation and invalidates a digital signal generated in the AD conversion.

* * * * *